United States Patent
Faur et al.

(10) Patent No.: US 10,622,495 B2
(45) Date of Patent: Apr. 14, 2020

(54) METHOD, PROCESS AND FABRICATION TECHNOLOGY FOR OXIDE LAYERS

(71) Applicant: Specmat, Inc., North Olmsted, OH (US)

(72) Inventors: Horia M. Faur, Medina, OH (US); Maria Faur, North Olmsted, OH (US)

(73) Assignee: SPECMAT, Inc., North Olmsted, OH (US)

( * ) Notice: Subject to any disclaimer, the term of this patent is extended or adjusted under 35 U.S.C. 154(b) by 0 days.

(21) Appl. No.: 15/126,871

(22) PCT Filed: Mar. 18, 2015

(86) PCT No.: PCT/US2015/021291
§ 371 (c)(1),
(2) Date: Sep. 16, 2016

(87) PCT Pub. No.: WO2015/143056
PCT Pub. Date: Sep. 24, 2015

(65) Prior Publication Data
US 2017/0098720 A1    Apr. 6, 2017

Related U.S. Application Data

(60) Provisional application No. 61/954,740, filed on Mar. 18, 2014.

(51) Int. Cl.
*H01L 31/0216* (2014.01)
*H01L 21/02* (2006.01)
(Continued)

(52) U.S. Cl.
CPC .. *H01L 31/02168* (2013.01); *H01L 21/02164* (2013.01); *H01L 21/02282* (2013.01);
(Continued)

(58) Field of Classification Search
CPC .......... H01L 31/02168; H01L 31/1804; H01L 31/1868; H01L 21/02164; H01L 21/02282;
(Continued)

(56) References Cited

U.S. PATENT DOCUMENTS 5,409,569 A * 4/1995 Seki .................... C11D 7/08
134/3
5,747,180 A * 5/1998 Miller .................. G11B 5/8404
205/124
(Continued)

FOREIGN PATENT DOCUMENTS

EP    2626914 A2    8/2013
WO    2008/157345 A2    12/2008
(Continued)

OTHER PUBLICATIONS

International Search Report for PCT/US2015/021291 dated Jun. 17, 2015.
(Continued)

*Primary Examiner* — Brian K Talbot
(74) *Attorney, Agent, or Firm* — Joseph J. Crimaldi

(57) ABSTRACT

This disclosure relates to a Room Temperature Wet Chemical Growth (RTWCG) method and process of SiOX thin film coatings which can be grown on various substrates. The invention further relates to RTWCG method and process suited to grow thin films on the Si substrates used in the manufacture of silicon-based electronic and photonic (optoelectronic) device applications. The invention further relates to processes used to produce SiOX thin film layers for use as passivation layers, low reflectance layers, or high reflectance single layer coatings (SLARC) and selective emitters (SE).

7 Claims, 9 Drawing Sheets

(51) Int. Cl.
    *H01L 21/306*     (2006.01)
    *H01L 31/18*     (2006.01)
    *B05D 3/02*     (2006.01)
    *H05K 3/28*     (2006.01)
    *H05K 3/46*     (2006.01)

(52) U.S. Cl.
    CPC .. *H01L 21/30604* (2013.01); *H01L 31/02167* (2013.01); *H01L 31/1804* (2013.01); *H01L 31/1868* (2013.01); *B05D 3/0209* (2013.01); *H05K 3/28* (2013.01); *H05K 3/4673* (2013.01); *Y02E 10/50* (2013.01)

(58) Field of Classification Search
    CPC .. H01L 21/30604; B05D 3/0209; H05K 3/28; H05K 3/4673
    USPC ................................. 427/96.2, 126.3, 379
    See application file for complete search history.

(56) References Cited

U.S. PATENT DOCUMENTS

| | | | |
|---|---|---|---|
| 6,326,315 B1 | 12/2001 | Uchiyama et al. | |
| 2002/0026900 A1* | 3/2002 | Huang | C23C 16/4581 118/730 |
| 2008/0075650 A1* | 3/2008 | Djokic | A01N 59/16 423/397 |
| 2010/0112728 A1* | 5/2010 | Korzenski | H01L 21/02079 438/3 |
| 2011/0028000 A1* | 2/2011 | Rogojina | H01L 21/30604 438/753 |
| 2011/0162706 A1* | 7/2011 | Borden | H01L 31/03682 136/256 |
| 2012/0160320 A1* | 6/2012 | Braun | C09K 13/08 136/256 |
| 2013/0206229 A1 | 8/2013 | Watabe et al. | |
| 2013/0298984 A1 | 11/2013 | Kherani et al. | |
| 2014/0051248 A1* | 2/2014 | Dong | H01L 31/1804 438/689 |

FOREIGN PATENT DOCUMENTS

| | | |
|---|---|---|
| WO | 2012/036760 A1 | 3/2012 |
| WO | 2013/059806 A1 | 4/2013 |

OTHER PUBLICATIONS

European Supplementary Search Report dated Sep. 27, 2017 for EP Application No. 15765483.
Extended European Search Report dated Oct. 9, 2017 for EP Application No. 15765483.

* cited by examiner

METHOD, PROCESS AND FABRICATION TECHNOLOGY FOR OXIDE LAYERS

RELATED APPLICATION DATA

This patent application claims priority to and is a national phase filing under 35 U.S.C. § 371 of PCT/US2015/021291 filed Mar. 18, 2015 and entitled "Process and Fabrication Technology for Oxide Layers," which itself claims priority to U.S. Provisional Patent Application No. 61/954,740, filed Mar. 18, 2014 and titled "Method, Process and Fabrication Technology for Oxide Layers." The complete text of these applications are hereby incorporated by reference as though fully set forth herein in their entireties.

FIELD OF INVENTION

This disclosure relates to a Room Temperature Wet Chemical Growth (RTWCG) method and process of SiOX thin film coatings which can be grown on various substrates. The invention further relates to RTWCG method and process suited to grow thin films on the Si substrates used in the manufacture of silicon-based electronic and photonic (optoelectronic) device applications. The invention further relates to processes used to produce SiOX thin film passivation layers for use as low reflectance single layer antireflection coatings (SLARC) and selective emitters (SE).

BACKGROUND OF THE INVENTION

Work has been underway for the high throughput production of solar cells utilizing "passivated emitter and rear cell" (PERC) and "passivated emitter and rear, totally-diffused" (PERT) device architecture. Both cell designs require that the rear side contains dielectric passivation. The materials of choice, to date, are aluminum oxide ($Al_2O_3$) or silicon dioxide ($SiO_2$). The thermal oxidation growth of $SiO_2$ requires temperatures in excess of 900° C. which is the main reason why thermal $SiO_2$ has not been implemented; silicon bulk lifetime is highly sensitive to high-temperature processes. $Al_2O_3$ can be deposited by various techniques such as atomic layer deposition (ALD), plasma enhanced chemical vapor deposition (PECVD), and reactive sputtering. Some of the drawbacks of these are that they increase the process steps and that the equipment required can be costly to own and operate.

In most PERC and PERT architectures, the rear side must be devoid of a diffused layer. Industrially, this is achieved by etching back the parasitic emitter utilizing a solution containing various concentrations of HF, $HNO_3$, and $H_2SO_4$. This etching process leaves behind a damaged surface that lowers the effective lifetime of silicon and so is then removed utilizing KOH.

SUMMARY OF THE INVENTION

This disclosure relates to a Room Temperature Wet Chemical Growth (RTWCG) method and process of SiOX thin film coatings which can be grown on various substrates. The invention further relates to RTWCG method and process suited to grow thin films on the Si substrates used in the manufacture of silicon-based electronic and photonic (optoelectronic) device applications. The invention further relates to processes used to produce SiOX thin film passivation layers for use as low reflectance single layer antireflection coatings (SLARC) and selective emitters (SE).

In one embodiment, the present invention relates generally to the field of semiconductors and/or semiconductor structures (e.g., solar cells, etc.), to chemical compositions for manufacturing such semiconductors and/or semiconductor structures, and/or to methods for manufacturing such semiconductors and/or semiconductor structures. In another embodiment, the present invention relates to chemical compositions and methods for controlling surface passivation, silicon etchback, reflective, and other properties of semiconductor surfaces used for various semiconductor applications including, but not limited to, solar cells.

In one embodiment, the formulations of the present invention include the following various components given in weight percentages (w/w): (i) from about 44.7% to about 47.6% hydrofluoric acid, from about 0.224% to about 1.032% nitric acid, from about 0.471% to about 5.42% 2,4-dihydroxypyridine, with the remainder of this formulation being water; or (ii) from about 36.2% to about 46.7% hydrofluoric acid, from about 0.220% to about 0.835% nitric acid, from about 2.31% to about 23.4% pyridine, with the remainder of this formulation being water; or (iii) from about 39.6% to about 47.7% hydrofluoric acid, from about 0.225% to about 0.916% nitric acid, from about 0.236% to about 16.0% dichloropyridazin-3(2H)-one, with the remainder of this formulation being water; or (iv) from about 47.2% to about 47.8% hydrofluoric acid, from about 0.225% to about 1.09% nitric acid, about 0.00922% dichloropyridazin-3(2H)-one, with the remainder of this formulation being water; or (v) from about 3.68% to about 10.5% hydrofluoric acid, from about 6.23% to about 20.3% nitric acid, from about 1.18% to about 14.4% sulfuric acid, from about 0.0000980% to about 0.0107% iodic acid, with the remainder of this formulation being water; or (vi) from about 42.9% to about 47.6% hydrofluoric acid, from about 0.00224% to about 1.32% nitric acid, from about 0.471% to about 8.68% pyridoxine hydrochloride, with the remainder of this formulation being water; (vii) from about 1.0% to about 48% hydrofluoric acid, from about 0.00090% to about 0.050% silver (I) oxide, with the remainder of this formulation being water; or (viii) from about 1.0% to about 48% hydrofluoric acid, from about 0.00080% to about 0.20% selenic acid, with the remainder of this formulation being water.

In one embodiment, the present invention is a solution comprising: (i) one or more fluorine-containing acid compounds or fluorine-containing acids; (ii) nitric acid; (iii) one or more additional compounds selected from one or more of 2,4-dihydroxypyridine, pyridine, dichloropyridazin-3(2H)-one, one or more iodine-containing acids, sulfuric acid, pyridoxine hydrochloride, selenic acid, silver (I) oxide, or silver (II) oxide; and (iv) water.

In another embodiment, the present invention is a solution comprising: (A) one or more fluorine-containing acid compounds or fluorine-containing acids; (B) one or more additional compounds selected from one or more of 2,4-dihydroxypyridine, pyridine, dichloropyridazin-3(2H)-one, one or more iodine-containing acids, sulfuric acid, pyridoxine hydrochloride, one or more selenium-containing acid compounds or selenium-containing acids, silver (I) oxide, or silver (II) oxide; and (C) water.

In still another embodiment, the present invention is a solution comprising: (a) from about 35% to about 50% by weight of one or more acids and/or acidic compounds, wherein the one or more acids and/or acidic compounds are selected from one or more of fluoride-containing acid compounds or fluorine-containing acidic compounds, nitric acid, sulfuric acid, or any combinations of any two of these acids or acidic compounds, or even all three of these acids or acidic compounds; (b) at least one of the following additional components: (b1) from about 0.005% to about 25% by weight of one or more additives selected from 2,4-dihydroxypyridine, pyridine, dichloropyridazin-3(2H)-one, or pyridoxine hydrochloride; (b2) from about 0.00005% to about 0.25% by weight of a second acid selected from an iodine-containing acid, a selenium-containing acid, or the combination thereof; or (b3) from about 0.0005% to about 0.075% by weight of silver (I) oxide or silver (II) oxide; and (c) the remainder being water.

In the embodiments detailed above (and more fully discussed below), although the total amount of each component of the compounds of the present invention may individually total more than 100 weight percent when each component is taken individually and totaled using the broadest amounts disclosed herein, one of skill in the art will realize that this is not the case.

DETAILED DESCRIPTION OF THE INVENTION

Figure 1:
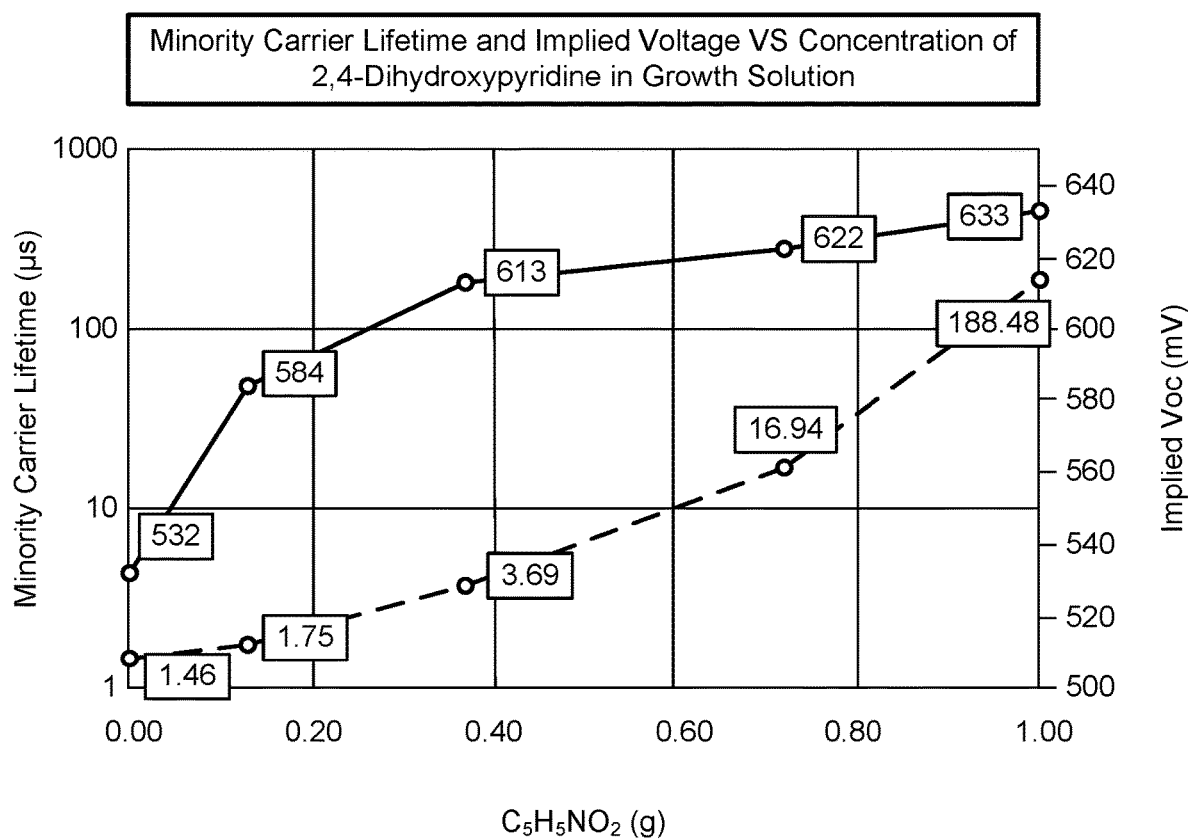
FIG. 1 is a graph illustrating the improved passivation obtained through the incorporation of 2,4-dihydroxypyridine in a $HF_{(aq)}/HNO_{3(aq)}$ system.

As noted above, this disclosure relates to a Room Temperature Wet Chemical Growth (RTWCG) method and process of SiOX thin film coatings which can be grown on various substrates. The invention further relates to RTWCG method and process suited to grow thin films on the Si substrates used in the manufacture of silicon-based electronic and photonic (optoelectronic) device applications. The invention further relates to processes used to produce SiOX thin film passivation layers for use as low reflectance single layer antireflection coatings (SLARC) and selective emitters (SE).

In one embodiment, the formulations described herein utilize one or more of hydrofluoric acid (HF), nitric acid ($HNO_3$), sulfuric acid ($H_2SO_4$) in combination with one or more additives to create a SiOX layer where Si is silicon, O is Oxygen and X can be an additive which can impart the oxide passivation qualities or other beneficial qualities. In some embodiments, the formulations of the present invention can also simultaneously remove a phosphorus diffused silicon layer in less than 80 seconds. In another embodiment, the formulations of the present invention can be tailored to create a resulting SiOX layer of specific thicknesses ranging from less than about 10 nm to over 500 nm. Since the PERT and PERC architecture requires the complete removal of the diffused layer on the rear side, the passivation layer creation does not require any additional process steps or any increases to the standard thermal budgets currently employed in the normal fabrication steps of solar cells.

In one embodiment, the present invention relates generally to the field of semiconductors and/or semiconductor structures (e.g., solar cells, etc.), to chemical compositions for manufacturing such semiconductors and/or semiconductor structures, and/or to methods for manufacturing such semiconductors and/or semiconductor structures. In another embodiment, the present invention relates to chemical compositions and methods for controlling surface passivation, silicon etchback, reflective, and other properties of semiconductor surfaces used for various semiconductor applications including, but not limited to, solar cells.

Thus, in one embodiment, the present invention relates to formulations that comprise the following components given in weight percentages (w/w): (a) from about 35% to about 50% of by weight of one or more acids and/or acidic compounds, where the one or more acids and/or acidic compounds are selected from one or more of fluoride-containing acid compounds (e.g., hydrofluoric acid (HF)) or fluorine-containing acidic compounds, nitric acid ($HNO_3$), sulfuric acid ($H_2SO_4$), any combinations of any two of these acids or acidic compounds, or even all three of these acids or acidic compounds, where component (a) is combined with at least one of the following additional components: (b1) from about 0.005% to about 25% of one or more additives selected from 2,4-dihydroxypyridine, pyridine, dichloropyridazin-3(2H)-one, or pyridoxine hydrochloride; or (b2) from about 0.00005% to about 0.25% of a second acid selected from an iodine-containing acid (e.g., iodic acid), a selenium-containing acid (e.g., selenic acid), or the combination thereof; or (b3) from about 0.0005% to about 0.075% silver (I) oxide or silver (II) oxide; and (c) the remainder of all of these formulations being water. Regarding component (a), when two or more acids and/or acidic compounds are present, it should be noted that the individual amounts of each of the two or more acids and/or acidic compounds, or even all three acids and/or acidic compounds, can be present at any amount so long as the amount of each of the two, or three, sub-components of component (a) add up to fall within the percent by weight range stated above.

In another embodiment, the present invention relates to formulations that comprise the following components given in weight percentages (w/w): (a) from about 35% to about 50% of by weight of one or more acids and/or acidic compounds, where the one or more acids and/or acidic compounds are selected from one or more of fluoride-containing acid compounds (e.g., hydrofluoric acid (HF)) or fluorine-containing acidic compounds, nitric acid ($HNO_3$), sulfuric acid ($H_2SO_4$), or any combinations of any two of these acids or acidic compounds, or even all three of these acids or acidic compounds, where component (a) is optionally further combined with at least one of the following additional components: (b1) from about 0.005% to about 25% of one or more additives selected from 2,4-dihydroxypyridine, pyridine, dichloropyridazin-3(2H)-one, or pyridoxine hydrochloride; or (b2) from about 0.00005% to about 0.25% of a second acid selected from an iodine-containing acid (e.g., iodic acid), a selenium-containing acid (e.g., selenic acid), or the combination thereof; or (b3) from about 0.0005% to about 0.075% silver (I) oxide and/or silver (II) oxide; and (c) the remainder of all of these formulations being water.

In another embodiment, the amount of component (a) in any of the above embodiments is in the range of about 36% to about 49%, or from about 37% to about 48%, or from about 38% to about 47%, or from about 39% to about 46%, or from about 40% to about 45%, or from about 41% to about 44%, or even from about 42% to about 43%. Here, as well as elsewhere in the specification and claims, individual range values can be combined to form additional and/or non-disclosed ranges.

In another embodiment, the amount of component (b1), if present, in any of the above embodiments is in the range of about 0.01% to about 24%, or from about 0.05% to about 23%, or from about 0.1% to about 22%, or from about 0.5% to about 21%, or from about 1% to about 20%, or from about 2% to about 19%, or from about 3% to about 18%, or from about 4% to about 17%, or from about 5% to about 16%, or from about 6% to about 15%, or from about 7% to about 14%, or from about 8% to about 13%, or from about 9% to about 12%, or even from about 10% to about 11%. Here, as well as elsewhere in the specification and claims, individual range values can be combined to form additional and/or non-disclosed ranges.

In another embodiment, the amount of component (b2), if present, in any of the above embodiments is in the range of about 0.0001% to about 0.24%, or from about 0.0005% to about 0.23%, or from about 0.001% to about 0.22%, or from about 0.005% to about 0.21%, or from about 0.01% to about 0.20%, or from about 0.05% to about 0.19%, or from about 0.1% to about 0.18%, or from about 0.11% to about 0.17%, or from about 0.12% to about 0.16%, or from about 0.13% to about 0.15%, or even about 0.14%. Here, as well as elsewhere in the specification and claims, individual range values can be combined to form additional and/or non-disclosed ranges.

In another embodiment, the amount of component (b3), if present, in any of the above embodiments is in the range of about 0.001% to about 0.07%, or from about 0.005% to about 0.065%, or from about 0.01% to about 0.06%, or from about 0.02% to about 0.05%, or even from about 0.03% to about 0.04%. Here, as well as elsewhere in the specification and claims, individual range values can be combined to form additional and/or non-disclosed ranges.

Additionally, any additional and/or non-disclosed ranges created from any of the above component ranges can be combined to form any desired final formulation comprising component (a) with one or more of components (b1), (b2) and/or (b3), and component (c) (i.e., the water remainder). Furthermore, it should also be noted that any additional and/or non-disclosed ranges created from any of the above component ranges can be combined to form any desired final formulation comprising component (a) with one or more of the optional components (b1), (b2) and/or (b3), and component (c) (i.e., the water remainder).

In another embodiment, the formulations of the present invention include the following various components given in weight percentages (w/w): (i) from about 44.7% to about 47.6% hydrofluoric acid, from about 0.224% to about 1.032% nitric acid, from about 0.471% to about 5.42% 2,4-dihydroxypyridine, with the remainder of this formulation being water; or (ii) from about 36.2% to about 46.7% hydrofluoric acid, from about 0.220% to about 0.835% nitric acid, from about 2.31% to about 23.4% pyridine, with the remainder of this formulation being water; or (iii) from about 39.6% to about 47.7% hydrofluoric acid, from about 0.225% to about 0.916% nitric acid, from about 0.236% to about 16.0% dichloropyridazin-3(2H)-one, with the remainder of this formulation being water; or (iv) from about 47.2% to about 47.8% hydrofluoric acid, from about 0.225% to about 1.09% nitric acid, about 0.00922% dichloropyridazin-3(2H)-one, with the remainder of this formulation being water; or (v) from about 3.68% to about 10.5% hydrofluoric acid, from about 6.23% to about 20.3% nitric acid, from about 1.18% to about 14.4% sulfuric acid, from about 0.0000980% to about 0.0107% iodic acid, with the remainder of this formulation being water; or (vi) from about 42.9% to about 47.6% hydrofluoric acid, from about 0.00224% to about 1.32% nitric acid, from about 0.471% to about 8.68% pyridoxine hydrochloride, with the remainder of this formulation being water; (vii) from about 1.0% to about 48% hydrofluoric acid, from about 0.00090% to about 0.050% silver (I) oxide, with the remainder of this formulation being water; or (viii) from about 1.0% to about 48% hydrofluoric acid, from about 0.00080% to about 0.20% selenic acid, with the remainder of this formulation being water.

In all of the embodiments detailed above, although the total amount of each component of the compounds of the present invention may individually total more than 100 weight percent when each component is taken individually and totaled using the broadest amounts disclosed herein, one of skill in the art will realize that this is not the case.

Turning to FIG. 1, FIG. 1 shows the effect on lifetime and implied Voc of increasing the concentration of 2,4-dihydroxypyridine. This test was carried out on 3 cm×3 cm p-type multi-crystalline (MC) samples which were phosphorus diffused with a sheet resistance of 65 ohm/sq. Lifetime and implied voltage measurements were taken using a Sinton WCT-120 lifetime tool. The measurements were taken at a specified minority carrier density (MCD) of 4.00 E+14. The samples were fully submerged in a bath of each etch solution for 30 seconds, which was enough time to completely remove the phosphorus-diffused regions of both faces as verified by 4-point probe measurements.

TABLE 1

| Description | Temperature set points (° C.) | Time |
|---|---|---|
| Spin Dryer | 100 | 0:15:00 |
| PECVD | 400 | 0:05:00 |
| Metal Drying | 550 | 0:00:20 |

TABLE 1-continued

| Description | Temperature set points (° C.) | Time |
|---|---|---|
| Peak fire 1 | 800 | 0:00:05 |
| Peak fire 2 | 900 | 0:00:05 |

Table 1 contains data that was generated using a Nabertherm P300 oven to generate thermal budgets that are universal to solar cell fabrication. The solutions were created by adding 0.1 mL of 67% $HNO_3$ to 20 mL of 48% HF. 2,4-dihydroxypyridine was then added to the solutions and a sample was dipped for 30 seconds with mild agitation. Lifetime measurements were then taken after exposing the samples to a series of thermal budgets which are common to solar manufacturing; these thermal budgets are described in Table 1.

As is evident in FIG. 1, the minority carrier lifetime and implied voltage of the sample exposed to the HF/$HNO_3$ bath were very low, 1.46 μs and 532 mV, respectively. The minority carrier lifetime and implied voltage increased with each addition of 2,4-dihydroxypyridine to a maximum level of 188.48 μs and 633 mV, respectively. Since the resulting layer cannot affect the bulk lifetime, the observed minority carrier lifetime (and implied Voc) increases must be a result of the layer's ability to passivate the silicon surface.

Figure 2A:
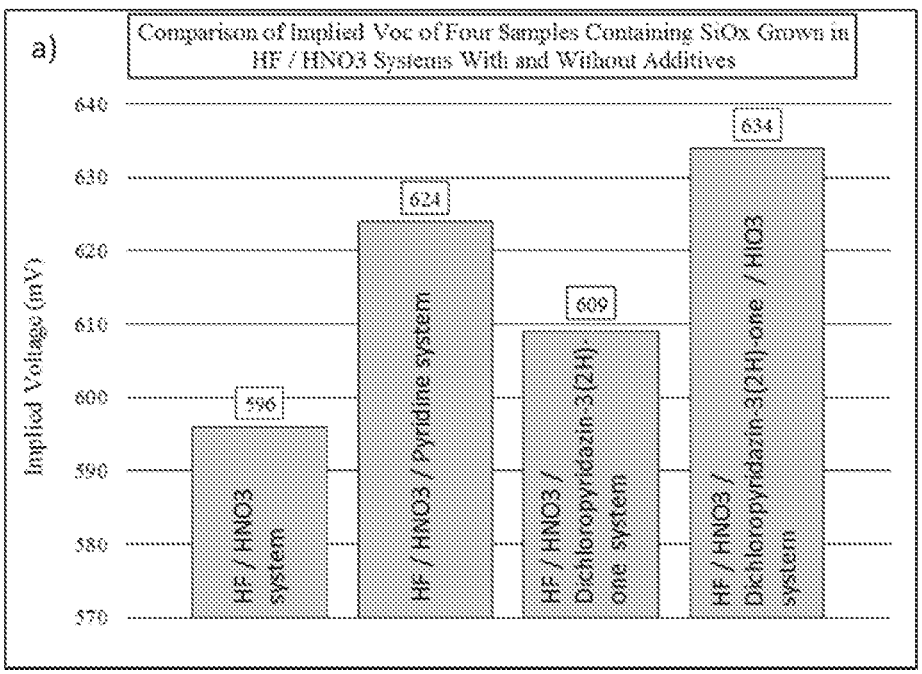
FIG. 2a is a graph illustrating the implied voltage gain of samples which were fully submerged in $HF_{(aq)}/HNO_{3(aq)}$ systems containing in one case pyridine additive, in another case dichloropyridazin-3(2H)-one additive, and in a third case a combination of dichloropyridazin-3(2H)-one and iodic acid.
Figure 2B:
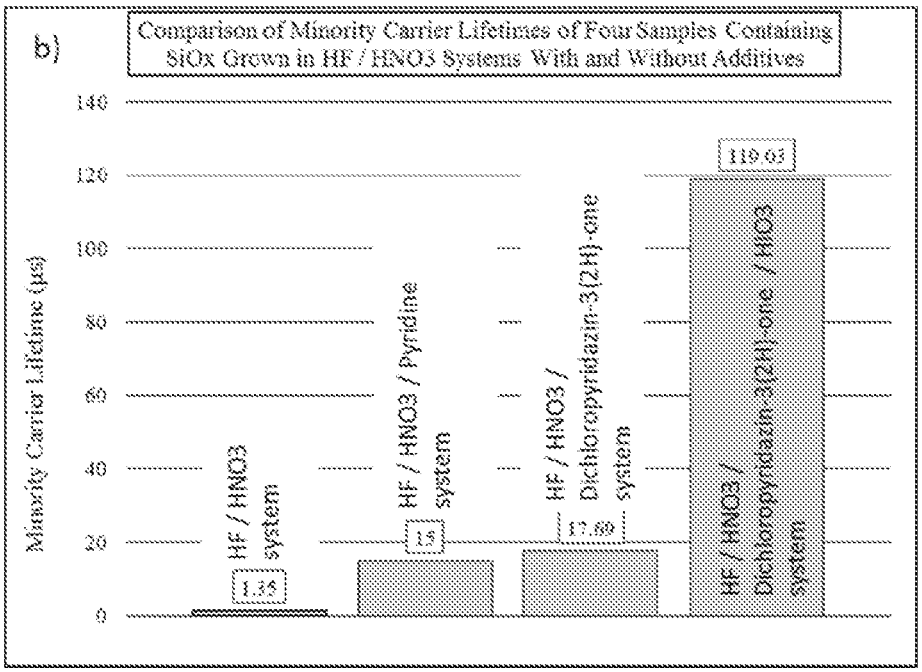
FIG. 2b is a graph illustrating the minority carrier lifetime gain of samples which were fully submerged in $HF_{(aq)}/HNO_{3(aq)}$ systems containing in one case pyridine additive, in another case dichloropyridazin-3(2H)-one additive, and in a third case a combination of dichloropyridazin-3(2H)-one and iodic acid.

Other additives to the HF/$HNO_3$ etching system that create a surface passivation layer have been found and are shown in FIGS. 2a and 2b. These additives include pyridine and dichloropyridazin-3(2H)-one. The implied voltages and minority carrier lifetimes in FIGS. 2a and 2b were measured on 3 cm×3 cm samples created from the same 6-inch MC wafer as the samples utilized to obtain the results of FIG. 1. The HF/$HNO_3$ system was created by adding 0.1 mL of 67% $HNO_3$ to 20 mL of 48% HF.

The HF/$HNO_3$/pyridine solution was created by adding 0.1 mL of 67% $HNO_3$ and 20 mL of 48% HF to 2 mL 99.0% pyridine. The HF/$HNO_3$/dichloropyridazin-3(2H)-one solution was created by adding 0.5 g of dichloropyridazin-3(2H)-one to a solution of 0.1 mL 67% $HNO_3$ and 20 mL 48% HF. The HF/$HNO_3$/dichloropyridazin-3(2H)-one/$HIO_3$ solution was created by adding 0.012 g of $HIO_3$ to the solution made by adding 0.5 g of dichloropyridazin-3(2H)-one to a solution of 0.1 mL 67% $HNO_3$ and 20 mL 48% HF. As with the results charted in FIG. 1, the lifetime measurements were taken using a Sinton WCT-120 tool after the samples were thermally treated (Table 1) using the QSSPC method. The implied Voc and lifetime values (see FIGS. 2a and 2b) show that the resulting layers passivate the surface well as compared to the HF/$HNO_3$ system.

The addition of $HIO_3$ improves the surface passivation of the resulting layer and also limits the thickness of the resulting passivation layer. Judging by color, the addition of 0.012 g $HIO_3$ to the HF/$HNO_3$/dichloropyridazin-3(2H)-one system arrested the resulting passivation layer thickness at approximately 50 nm versus a resulting passivation layer thickness of approximately 250 nm in the HF/$HNO_3$/dichloropyridazin-3(2H)-one system. The addition of $HIO_3$ to all of the systems described herein provides a reliable method for tailoring the thickness of the resulting passivation layer; increasing the [$HIO_3$] lowers the resulting passivation layer thickness.

Figure 3:
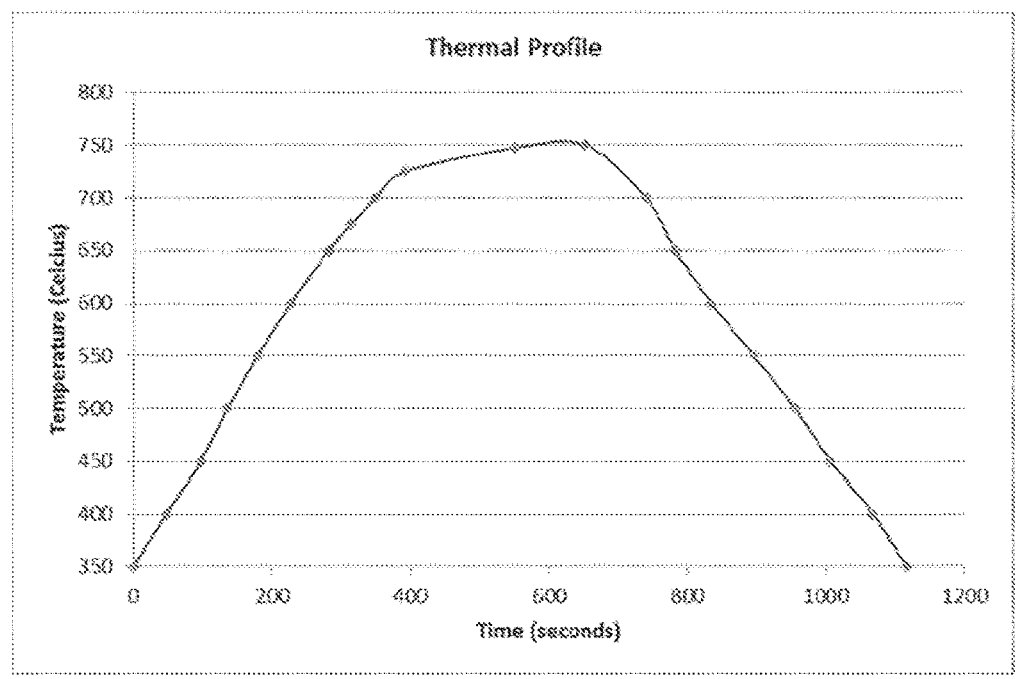
FIG. 3 is a graph illustrating the thermal budget used to anneal thin films created in either $HNO_{3(aq)}/HF_{(aq)}$ or $jHNO_{3(aq)}/HF_{(aq)}/H_2SO_{4(aq)}$ systems to which additives were added that improved the surface passivation of the resulting SiOX thin films.

The addition of iodine to a $HF_{(aq)}$/$HNO_{3(aq)}$ or $HF_{(aq)}$/$HNO_3$/$H_2SO_4$ etching solution offers the resulting films the ability to passivate the Si surface. The results shown in Table 2 are from a test conducted on 21 4 cm×4 cm samples cut from 4 monocrystalline sister wafers which were phosphorus diffused on both faces and had a sheet resistance of 65 Ω/sq. Utilizing a Sinton WCT 120 QSSPC lifetime tool, the lifetime of the samples were measured after the emitters were removed and then again after the resulting oxides were removed. To remove the emitters the solutions, described in Table 3, were used. Samples 1 to 21 were fully submerged in $HNO_3$/HF/$H_2SO_4$ solutions which removed the emitter from both faces in less than 60 seconds. Samples 1 to 3 were exposed to a solution described in Table 2 which did not contain an iodine source. Samples 4 to 6 were exposed to a solution which contained a $HIO_3$ concentration of 0.00935 g/L; Samples 7 to 9 were dipped in a solution containing a [$HIO_3$] of 0.0070; as can be seen from Table 2, 3 samples were grouped per each trial run in solutions containing increasing [$HIO_3$]. As the [$HIO_3$] increased, the thickness of the oxide layer became visually thinner (judged by color), as expected. The solutions containing even the smallest concentration of [$HIO_3$] were able to grow passivation oxides whereas the solution which did not contain [$HIO_3$] yielded an oxide which lowered the material's lifetime. The thermal budget utilized in these experiments is shown in FIG. 3 and was obtained by using a Nabertherm muffle furnace.

TABLE 2

| Sample | [HIO3] g/L | LT Post Thermal | Voc Post Thermal | LT Post Siox etch | Voc Post Siox etch | Average LT Delta | Average Voc Delta |
|---|---|---|---|---|---|---|---|
| 1 | 0 | 2.64 | 537 | 3 | 552 | −1.43 | −24.18 |
| 2 | | 1.41 | 524.00 | 4 | 554 | | |
| 3 | | 1.87 | 525.00 | 3 | 553 | | |
| 4 | 0.007010 | 16 | 589 | 5 | 554 | 18.42 | 39.36 |
| 5 | | 14 | 573 | 4 | 554 | | |
| 6 | | 38 | 625 | 4 | 561 | | |
| 7 | 0.009350 | 16 | 577 | 3 | 549 | 11.41 | 27.60 |
| 8 | | 14 | 576 | 4 | 544 | | |
| 9 | | 15 | 573 | 4 | 550 | | |
| 10 | 0.011700 | 19 | 607 | 3 | 537 | 19.23 | 58.23 |
| 11 | | 29 | 622 | 5 | 568 | | |
| 12 | | 21 | 598 | 3 | 547 | | |
| 13 | 0.014000 | 19 | 598 | 6 | 567 | 19.11 | 42.25 |
| 14 | | 17 | 580 | 4 | 545 | | |
| 15 | | 36 | 624 | 5 | 563 | | |
| 16 | 0.016400 | 16 | 600 | 4 | 541 | 15.78 | 54.63 |
| 17 | | 22 | 610 | 4 | 543 | | |
| 18 | | 21 | 599 | 4 | 562 | | |
| 19 | 0.018700 | 16 | 593 | 3 | 554 | 14.02 | 44.09 |

TABLE 2-continued

| Sample | [HIO3] g/L | LT Post Thermal | Voc Post Thermal | LT Post Siox etch | Voc Post Siox etch | Average LT Delta | Average Voc Delta |
|---|---|---|---|---|---|---|---|
| 20 | | 14 | 583 | 4 | 548 | | |
| 21 | | 22 | 612 | 3 | 554 | | |

As noted above, Table 2 contains data confirming beneficial effects of iodine addition to a $HF_{(aq)}/HNO_{3(aq)}$ etching system.

TABLE 3

| Samples | 48% HF (mL) | Water (mL) | 67% $HNO_3$ (mL) | 98% $H_2SO_4$ (mL) | [HIO3] g/L |
|---|---|---|---|---|---|
| 1 to 3 | 3.5 | 12.5 | 4.0 | 1.4 | 0 |
| 4 to 6 | 3.5 | 12.5 | 4.0 | 1.4 | 0.00935 |
| 7 to 9 | 3.5 | 12.5 | 4.0 | 1.4 | 0.0070 |
| 10 to 12 | 3.5 | 12.5 | 4.0 | 1.4 | 0.0117 |
| 13 to 15 | 3.5 | 12.5 | 4.0 | 1.4 | 0.0140 |
| 16 to 18 | 3.5 | 12.5 | 4.0 | 1.4 | 0.0164 |
| 19 to 21 | 3.5 | 12.5 | 4.0 | 1.4 | 0.0187 |

Table 3 contains data relating to the formulation of solutions used to etch the emitters of the sample in Table 2.

Pyridoxine hydrochloride added to $HF/HNO_3$ or $HF/HNO_3/H_2SO_4$ systems has been able to improve the resulting oxide's surface passivation properties. In one test, 0.5 g of pyridoxine hydrochloride was added to a solution made of 0.2 mL 67% $HNO_{3(aq)}$ and 20 mL 48% $HF_{(aq)}$. Six 4 cm×4 cm samples were cut from the same phosphorus diffused 60 ohm/sq multi-crystalline wafers. Three of the samples were fully submerged for 60 seconds in the $HF/HNO_3/C_8H_{11}NO_3.HCl$ to remove the phosphorus diffusion. The other three samples were submerged in a solution made of 0.2 mL 67% $HNO_{3(aq)}$ and 20 mL 48% $HF_{(aq)}$ which did not contain the pyridoxine hydrochloride additive. The lifetime of the material was measured after the thermal budget of Table 1. The average lifetime of the material that was dipped in the $HF/HNO_3$ system which did not contain the pyridoxine hydrochloride additive was 1.72 µs. The average for the samples exposed to the $HF/HNO_3/C_8H_{11}NO_3.HCl$ system was 5.92 µs, or a lifetime increase of 244%.

Figure 4:
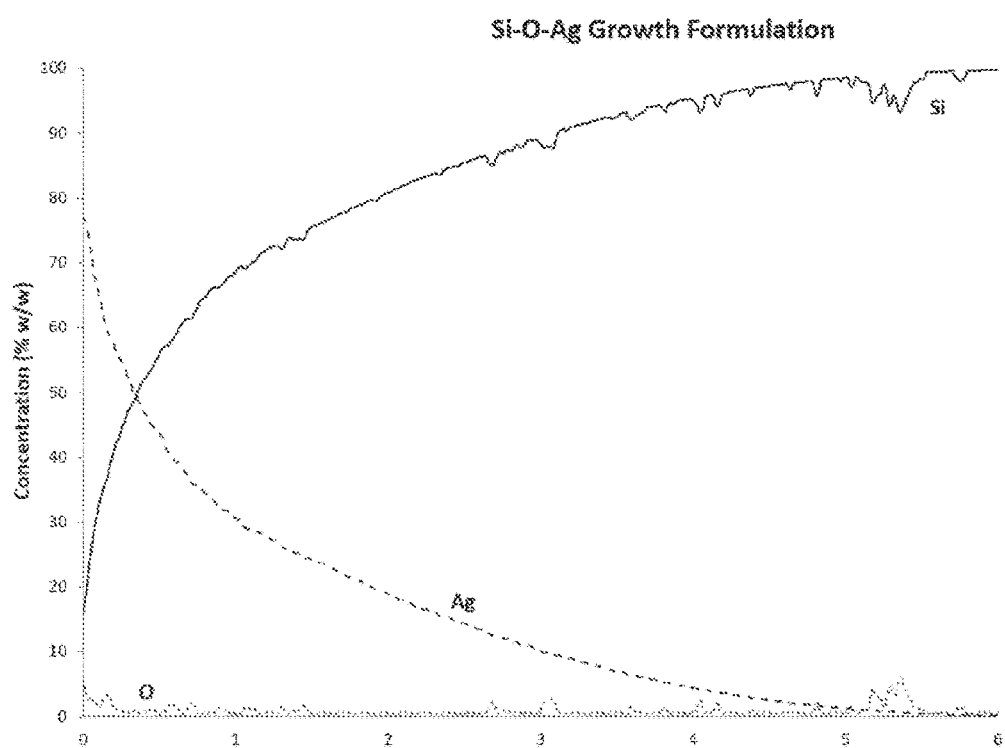
FIG. 4 is a graph of an XPS depth profile of a SiOX film in which the X was predominantly Ag created in a system containing silver oxide and $HF_{(aq)}$.

FIG. 4 is an XPS depth profile of a SiOX growth solution utilizing a $HF_{(aq)}$ system with 0.10 g of silver (I) oxide ($Ag_2O$) additive dissolved in a solution of 1 L of 10% $HF_{(aq)}$. For the silver additive silver (I) oxide ($Ag_2O$) and silver (II) oxide (AgO) have been successfully utilized to create SiOX thin films. As can be seen in the XPS depth profile, silver is a part of the SiOX oxide throughout the thickness of the resulting film. The resulting thin film can be used to create silver metallization or as a reflective film to reflect light back into a cell. $HF_{(aq)}$ or $HF_{(aq)}/HNO_{3(aq)}$ or $HF_{(aq)}/HNO_{3(aq)}/H2SO_{4(aq)}$ systems are able to create SiOAg films through inclusion of the $Ag_2O$ or AgO additive to the solution.

Figure 5:
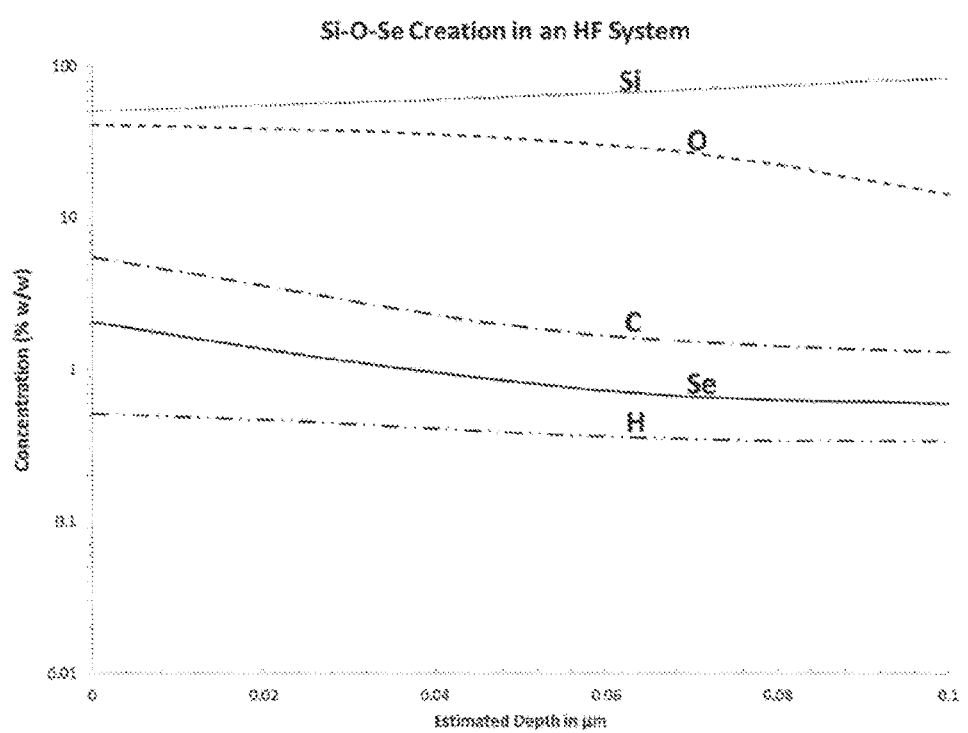
FIG. 5 is a graph of an XPS depth profile of a SiOX film in which the X component of the oxide's structure included selenium throughout the thickness of the film which was created by fully submerging the sample in a solution of selenic acid dissolved in $HF_{(aq)}$.

FIG. 5 is an XPS depth profile of a SiOX growth solution utilizing an $HF_{(aq)}$ system with 0.500 g of selenic acid (40% $H_2O_4Se_{(aq)}$) additive dissolved in a solution of 1 L of 10% $HF_{(aq)}$. As can be seen in the XPS depth profile, selenium is a part of the SiOX oxide throughout the thickness of the resulting film. Selenic acid can be used in a $HF_{(aq)}/HNO_{3(aq)}$ or $HF_{(aq)}/HNO_{3(aq)}/H_2SO_{4(aq)}$ systems to improve the resulting oxide's surface passivation properties.

Figure 6:
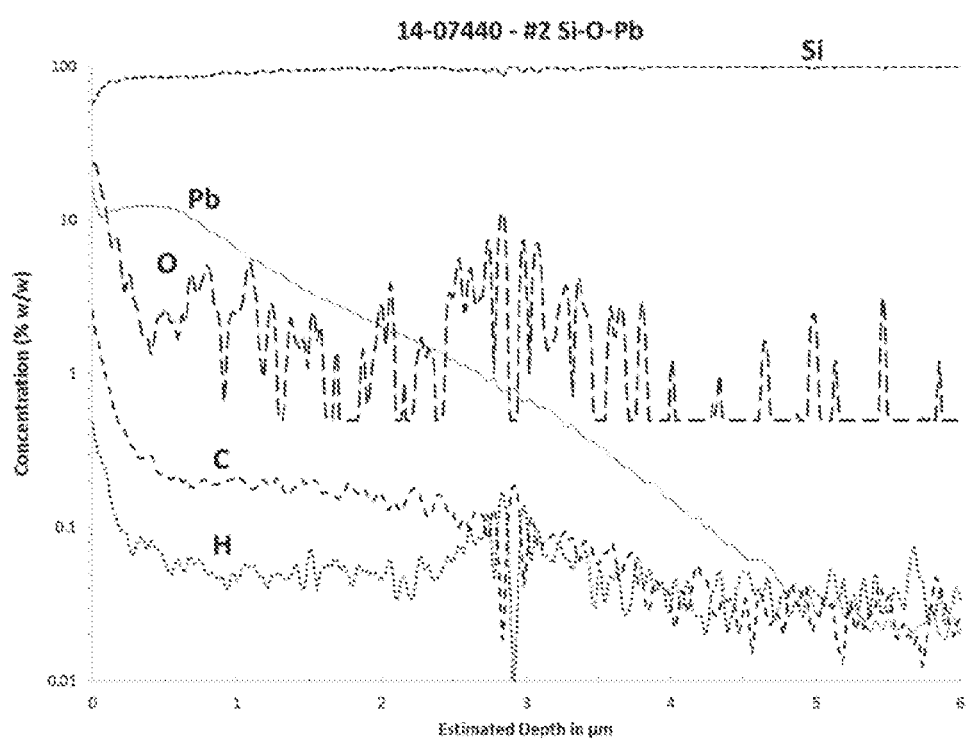
FIG. 6 is a graph of an XPS depth profile of a SiOX film in which the X was predominantly lead created in a $HF_{(aq)}$ system containing lead oxide additive.

FIG. 6 is an XPS depth profile of a SiOX growth solution utilizing an $HF_{(aq)}$ system with 0.20 g of lead oxide (PbO) additive dissolved in a solution of 1 L of 15% HF(aq). As can be seen in the XPS depth profile, lead is a part of the SiOX oxide throughout the thickness of the resulting film.

It should be noted that the present disclosure is not limited to solely the use of HF. Rather, any suitable fluoride-containing acid compound, or fluorine-containing acidic compound may be useful herein. Also, the present disclosure is not limited to solely the use of the pyridine compounds disclosed herein. Rather, a wide range of compounds that contain a pyridine ring structure within an organic compound can be utilized in connection with the present disclosure. Also, the present disclosure is not limited to solely the use of iodic acid ($HIO_3$). Rather, a wide range of compounds that contain iodine can be utilized in connection with the present disclosure. Also, the present disclosure is not limited to solely one thermal budget for the purpose of annealing the wet chemical films produced. Rather, a wide range of thermal profiles can be used in connection with the present disclosure.

In light of the above, the present invention is, in one embodiment, a solution comprising: (i) one or more fluorine-containing acid compounds or fluorine-containing acids; (ii) nitric acid; (iii) one or more additional compounds selected from one or more of 2,4-dihydroxypyridine, pyridine, dichloropyridazin-3(2H)-one, one or more iodine-containing acids, sulfuric acid, pyridoxine hydrochloride, selenic acid, or silver (I) oxide, or silver (II) oxide; and (iv) water.

In one embodiment, the component (i) in the above solution is hydrofluoric acid. In another embodiment, the above solution is comprised of: (i) hydrofluoric acid; (ii) nitric acid; (iii) 2,4-dihydroxypyridine; and (iv) water. In still another embodiment, the above solution is comprised of: (i) hydrofluoric acid; (ii) nitric acid; (iii) pyridine; and (iv) water. In still yet another embodiment, the above solution is comprised of: (i) hydrofluoric acid; (ii) nitric acid; (iii) dichloropyridazin-3(2H)-one; and (iv) water. In still yet another embodiment, the above solution is comprised of: (i) hydrofluoric acid; (ii) nitric acid; (iii) sulfuric acid and one or more iodine-containing acids; and (iv) water. In still yet another embodiment, component (iii) of the immediately preceding solution is iodic acid. In still yet another embodiment, the above solution is comprised of: (i) hydrofluoric acid; (ii) nitric acid; (iii) pyridoxine hydrochloride; and (iv) water.

In one embodiment, the solutions detailed above are formulated to etch silicon quickly enough to remove an emitter in less than about 80 seconds. In another embodiment, the solutions detailed above are formulated to grow a thin film that passivates the surface after a thermal budget has been applied thereto. In one embodiment, the thermal budget is an annealing budget comprising a ramp-up leg of about 400 seconds at a temperature of from about 350° C. to about 725° C., followed by a plateau of about 300 seconds, and then a ramp-down leg of about 400 seconds down to a temperature of about 350° C.

In another embodiment, the present invention relates to a solution comprising: (A) one or more fluorine-containing acid compounds or fluorine-containing acids; (B) one or more additional compounds selected from one or more of 2,4-dihydroxypyridine, pyridine, dichloropyridazin-3(2H)-one, one or more iodine-containing acids, sulfuric acid, pyridoxine hydrochloride, one or more selenium-containing acid compounds or selenium-containing acids, or silver (I) oxide, or silver (II) oxide; and (C) water. In one embodiment, component (A) is hydrofluoric acid.

In another embodiment, the above solution is comprised of: (A) hydrofluoric acid; (B) silver (I) oxide; and (C) water. In still another embodiment, the above solution is comprised of: (A) hydrofluoric acid; (B) silver (II) oxide; and (C) water. In still yet another embodiment, the above solution is comprised of: (A) hydrofluoric acid; (B) one or more selenium-containing acid compounds or selenium-containing acids; and (C) water. In one instance, component (B) of this solution is selenic acid.

In one embodiment, the solutions detailed above that contain components (A) through (C) are formulated to etch silicon quickly enough to remove an emitter in less than about 80 seconds. In another embodiment, these solutions are formulated to grow a thin film that passivates the surface after a thermal budget has been applied thereto. In one embodiment, the thermal budget is an annealing budget comprising a ramp-up leg of about 400 seconds at a temperature of from about 350° C. to about 725° C., followed by a plateau of about 300 seconds, and then a ramp-down leg of about 400 seconds down to a temperature of about 350° C.

In still yet another embodiment, the present invention comprises: (a) from about 35% to about 50% by weight of one or more acids and/or acidic compounds, wherein the one or more acids and/or acidic compounds are selected from one or more of fluoride-containing acid compounds or fluorine-containing acidic compounds, nitric acid, sulfuric acid, or any combinations of any two of these acids or acidic compounds, or even all three of these acids or acidic compounds; (b) at least one of the following additional components: (b1) from about 0.005% to about 25% by weight of one or more additives selected from 2,4-dihydroxypyridine, pyridine, dichloropyridazin-3(2H)-one, or pyridoxine hydrochloride; (b2) from about 0.00005% to about 0.25% by weight of a second acid selected from an iodine-containing acid, a selenium-containing acid, or the combination thereof; or (b3) from about 0.0005% to about 0.075% by weight of silver (I) oxide and/or silver (II) oxide; and (c) the remainder being water. In one embodiment, the one or more acids and/or acidic compounds of component (a) are selected from hydrofluoric acid, nitric acid, sulfuric acid. In one embodiment, the iodine-containing acid of component (b2) is iodic acid. In one embodiment, the selenium-containing acid of component (b3) is selenic acid.

Figure 7:
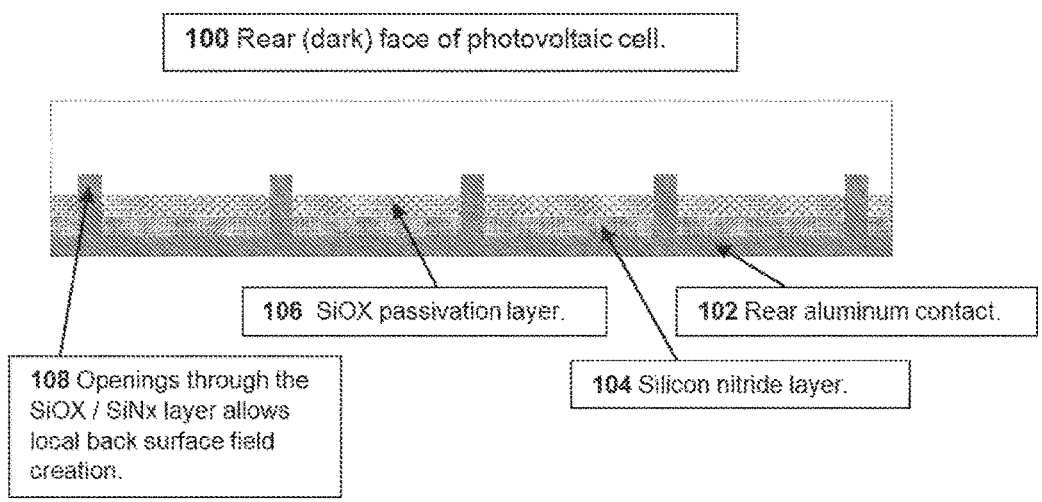
FIG. 7 is an illustration of the rear side of a photovoltaic cell which contains a PERC structure.

FIG. 7 is an illustration of the rear side of a photovoltaic cell which contains a passivated emitter rear contact (PERC) structure. Given this, the structure 100 of FIG. 7 includes a rear aluminum contact layer 102, a silicon nitride layer 104 located on top of rear aluminum contact layer 102, and a SIOX passivation layer 106 located on top of silicon nitride (SiN$_x$) layer 104. As illustrated in FIG. 7, openings 108 through the SIOX and SiN$_x$ layers permit the formation, or creation, of a local back surface field.

To create this PERC structure of FIG. 7, diffused wafers would be floated, using a single-sided wet bench tool, on the RTWCG solution to concomitantly remove the rear diffused material and grow the SIOX passivation thin film. Next, silicon nitride would be deposited on both front and rear faces. Openings through the dielectric stack could be created utilizing laser ablation. Front and rear metallization is accomplished by screen printing and lastly the cells would be fired in a firing furnace.

Figure 8:
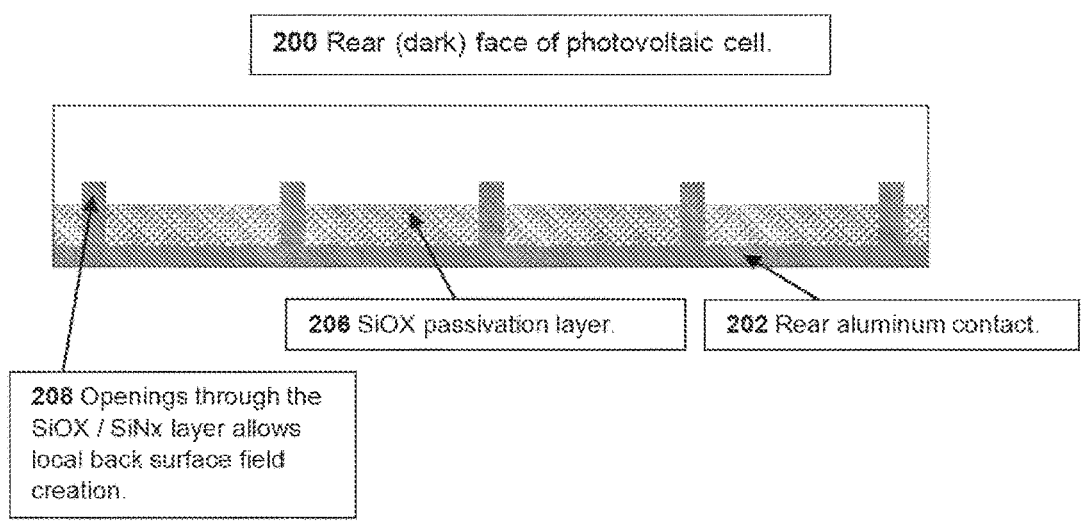
FIG. 8 is an illustration of a PERC structure which does not contain silicon nitride deposited on the SIOX passivation film.

Alternatively, FIG. 8 is an illustration of a PERC structure which does not contain silicon nitride deposited on the SIOX passivation film. Given this, the structure 200 of FIG. 8 includes a rear aluminum contact layer 202 and a SIOX passivation layer 206 located on top of rear aluminum contact layer 202. As illustrated in FIG. 8, openings 208 through the SiOX passivation layer permit the formation, or creation, of a local back surface field. In this case to create the structure of FIG. 8, the RTWCG solution would grow an appropriately thick SIOX film to block aluminum and allow the formation of local back surface fields. To create this PERC structure, diffused wafers would be floated, using a single-sided wet bench tool, on the RTWCG solution to concomitantly remove the rear diffused material and grow the SIOX passivation thin film. Next, silicon nitride would be deposited only on the front face. Openings through the SiOX could be created utilizing laser ablation. Front and rear metallization is accomplished by screen printing and then fired using a firing furnace.

Figure 9:
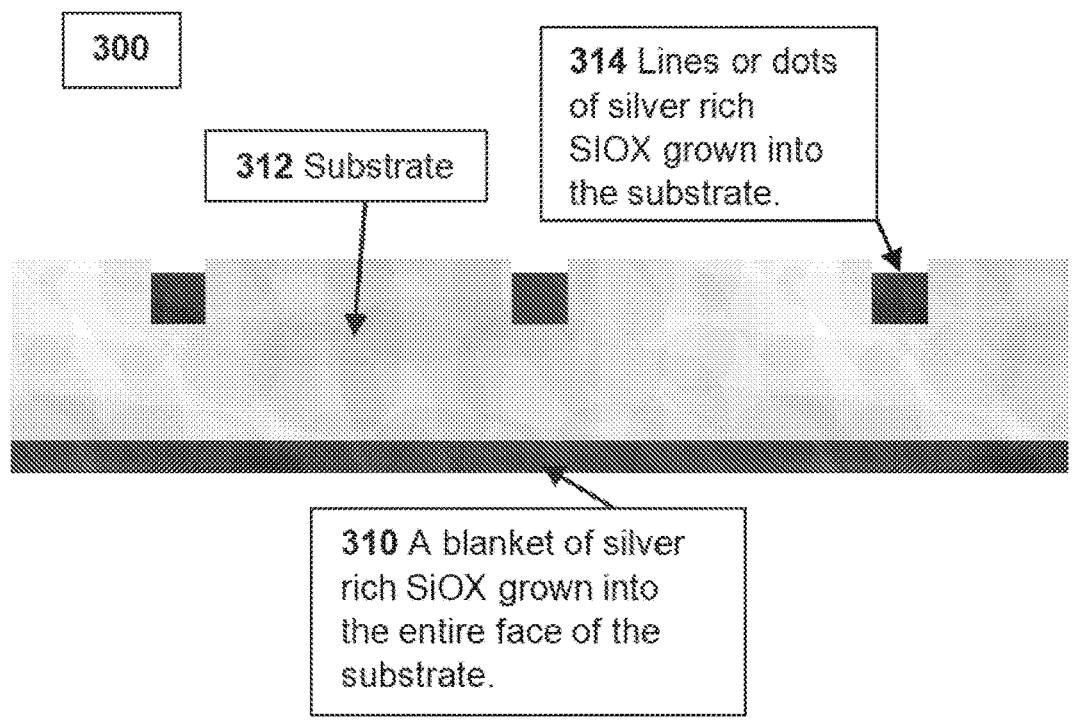
FIG. 9 is an illustration of one type of structure that can be produced using a chemical solution according one or more embodiments of the present invention where such solution enables the growth of one or more silver-rich SiOX films.

Silver-rich SiOX films such as described in FIG. 4 can be utilized to create structures such as described in FIG. 9. As illustrated in FIG. 9, structure 300 contains a bottom layer 310 formed from a silver-rich SiOX layer that is formed on, for example, the underside of a substrate material 312. Substrate material 312 can be any suitable silicon substrate material known to be useful as a substrate-forming material to those of skill in the solar cell and/or semiconductor arts. As is known in the solar cell and/or semiconductor arts, substrate 312 can be etched, or patterned, by any suitable technique so as to form features within, or on, substrate 312 that can later be filled with silver-rich SiOX material 314 using one or more of the solutions of the present invention. To that end, one non-limiting example is one or more masking techniques that could be employed to grow dots or lines 314 of silver-rich SiOX into the silicon substrate 312. Alternatively, or additionally, silver-rich SiOX layer 310 could be grown on an entire face by floating the substrates on the RTWCG solution using a single-sided chemical bench. This allows the technology to be employed to create collection grids for a photovoltaic cell. Growing a silver-rich SiOX layer 310 over an entire face of the substrate will improve light trapping by reflecting light back into the silicon substrate. Although FIG. 9 illustrates a structure where a silver-rich SiOX layer 310 is grown completely over the "backface" of substrate 312, the present invention is not limited thereto. Rather, if so desired a silver-rich SiOX layer 310 can be grown on any desired surface of a substrate using the technique described above.

It should be noted that the labeling utilized in the attached claim set is for the sake of convenience only and that upon reading and understanding the disclosure contained in the present specification one would recognize how the various labeling schemes in the specification relate to the various labeling schemes utilized in the attached claim set.

While specific embodiments of the present invention have been shown and described in detail to illustrate the application and principles of the invention, it will be understood that it is not intended that the present invention be limited thereto and that the invention may be embodied otherwise without departing from such principles. In some embodiments of the invention, certain features of the invention may sometimes be used to advantage without a corresponding use of the other features. Accordingly, all such changes and embodiments properly fall within the scope of the following claims.

What is claimed is:

1. A method for growing, or creating, a passivation oxide on silicon, the method comprising the steps of:
   (A) supplying a chemical solution comprising:
   (A1) one or more fluorine-containing acid compounds or fluorine-containing acids, wherein the one or more fluorine-containing acid compounds or fluorine-containing acids are present in the range of about 35% by weight to about 50% by weight;
   (A2) nitric acid, wherein the nitric acid is present in the range of about 0.00224% by weight to about 1.32% by weight;
   (A3) one or more of 2,4-dihydroxypyridine, pyridine, dichloropyridazin-3(2H)-one and/or pyridoxine hydrochloride, wherein the one or more of 2,4-dihydroxypyridine, pyridine, dichloropyridazin-3(2H)-one and/or pyridoxine hydrochloride are present in the range of about 0.005% by weight to about 25% by weight;
   (A4) optionally, one or more additional compounds selected from:
      (A4a) one or more iodine-containing acids, wherein the one or more iodine-containing acids are present in the range of about 0.00005% by weight to about 0.25% by weight; and/or
      (A4b) one or more selenium-containing acid compounds or selenium-containing acids, wherein the one or more selenium-containing acid compounds or selenium-containing acids, when present, are present in the range of about 0.00005% by weight to about 0.25% by weight; and
   (A5) the remainder of the chemical solution being water;
   (B) exposing a silicon surface to the solution of Step (A); and
   (C) subjecting the silicon to a thermal treatment step comprising:
      (C1) a ramp-up step of about 400 seconds at a temperature of from about 350° C. to about 725° C.;
      (C2) a plateau step of about 300 seconds; and
      (C3) a ramp down step to room temperature,
   wherein the solution is formulated to grow a thin oxide film that passivates the surface after the thermal treatment of Step (C) has been applied thereto.

2. The method of claim 1, wherein component (A1) is hydrofluoric acid.

3. The method of claim 1, wherein component (A1) is hydrofluoric acid and component (A4) is present and is selected from (A4a).

4. The method of claim 1, wherein component (A1) is hydrofluoric acid and component (A4) is present and is selected from (A4b).

5. The method of claim 1, wherein component (A1) is hydrofluoric acid and component (A4) is present and is selected from both (A4a) and (A4b).

6. The method of claim 1, wherein the silicon surface further comprises at least one emitter and the solution is formulated to etch silicon quickly enough to remove an emitter in less than about 80 seconds.

7. The method of claim 1, wherein the thermal treatment of Step (C) is an annealing budget comprising a ramp-up Step (C1) of about 400 seconds at a temperature of from about 350° C. to about 725° C., followed by a plateau Step (C2) of about 300 seconds, then a pre-ramp-down step of about 400 seconds down to a temperature of about 350° C., followed by a ramp down Step (C3) to room temperature.

* * * * *